(12) United States Patent
Wang et al.

(10) Patent No.: US 10,396,237 B2
(45) Date of Patent: Aug. 27, 2019

(54) LIGHT-EMITTING DIODE SUBSTRATE AND MANUFACTURING METHOD THEREOF, AND DISPLAY DEVICE

(71) Applicant: BOE TECHNOLOGY GROUP CO., LTD., Beijing (CN)

(72) Inventors: Long Wang, Beijing (CN); Yanzhao Li, Beijing (CN); Chieh Hsing Chung, Beijing (CN); Jie Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 38 days.

(21) Appl. No.: 15/542,234

(22) PCT Filed: Jan. 6, 2017

(86) PCT No.: PCT/CN2017/070450
§ 371 (c)(1),
(2) Date: Jul. 7, 2017

(87) PCT Pub. No.: WO2017/181743
PCT Pub. Date: Oct. 26, 2017

(65) Prior Publication Data
US 2018/0219123 A1    Aug. 2, 2018

(30) Foreign Application Priority Data

Apr. 19, 2016 (CN) .......................... 2016 1 0245083

(51) Int. Cl.
*H01L 33/00* (2010.01)
*H01L 27/15* (2006.01)
*H01L 25/075* (2006.01)

(52) U.S. Cl.
CPC .......... *H01L 33/0079* (2013.01); *H01L 27/15* (2013.01); *H01L 33/00* (2013.01);
(Continued)

(58) Field of Classification Search
CPC ... H01L 25/0753; H01L 27/15; H01L 27/156; H01L 33/00; H01L 33/0079; H01L 2933/0025
See application file for complete search history.

(56) References Cited

U.S. PATENT DOCUMENTS 6,872,635 B2 * 3/2005 Hayashi ............... H01L 21/6835
                                                      438/463
7,015,055 B2 * 3/2006 Oohata ..................... G09F 9/33
                                                      438/108
(Continued)

FOREIGN PATENT DOCUMENTS

CN          1683995 A       10/2005
CN          1770017 A        5/2006
(Continued)

OTHER PUBLICATIONS

Search Report and Written Opinion dated Mar. 31, 2017 from State Intellectual Property Office of the P.R. China.
(Continued)

*Primary Examiner* — Mary A Wilczewski
(74) *Attorney, Agent, or Firm* — Dilworth & Barrese, LLP.; Michael J. Musella, Esq.

(57) ABSTRACT

A light-emitting diode substrate and a manufacturing method thereof, and a display device are provided. The manufacturing method of a light-emitting diode (LED) substrate, including: disposing a supporting substrate supporting a plurality of LED units to be opposed to a receiving substrate so that a side of the supporting substrate facing the receiving substrate supports the plurality of LED units; and irradiating a side of the supporting substrate away from the receiving substrate with laser, stripping the LED units from the supporting substrate, and transferring the LED units onto the receiving substrate. The manufacturing method of the
(Continued)

LED substrate can better transfer LED units from the supporting substrate onto the receiving substrate.

18 Claims, 16 Drawing Sheets

(52) U.S. Cl.
CPC ........ *H01L 25/0753* (2013.01); *H01L 27/156* (2013.01); *H01L 2933/0025* (2013.01)

(56) References Cited

U.S. PATENT DOCUMENTS

| | | | |
|---|---|---|---|
| 7,223,514 B2 | 5/2007 | Kang et al. | |
| 7,491,557 B2 | 2/2009 | Park | |
| 7,532,262 B2 | 5/2009 | Kim | |
| 8,257,538 B2* | 9/2012 | Doi | H01L 21/6835 156/241 |
| 8,324,029 B2* | 12/2012 | Ohtorii | H01L 31/153 438/118 |
| 8,349,116 B1* | 1/2013 | Bibl | H01L 21/67144 156/249 |
| 8,507,156 B2 | 8/2013 | Park et al. | |
| 8,647,923 B2* | 2/2014 | Sakaguchi | H01L 21/563 438/108 |
| 8,847,079 B2* | 9/2014 | Dellmann | B81C 1/00373 174/254 |
| 9,496,155 B2* | 11/2016 | Menard | H01L 21/6835 |
| 9,705,029 B2* | 7/2017 | Huang | H01L 22/12 |
| 9,842,782 B2* | 12/2017 | Chen | H01L 21/67144 |
| 9,893,041 B2* | 2/2018 | Pokhriyal | H01L 21/6835 |
| 10,002,856 B1* | 6/2018 | Bedell | H01L 25/0753 |
| 10,020,293 B2* | 7/2018 | Zou | H01L 33/0079 |
| 10,020,420 B2* | 7/2018 | Zou | H01L 25/0753 |
| 10,032,973 B1* | 7/2018 | Bedell | H01L 33/62 |
| 10,096,740 B1* | 10/2018 | Chen | H01L 33/005 |
| 2004/0038519 A1* | 2/2004 | Yanagisawa | H01L 21/31138 438/637 |
| 2005/0233504 A1* | 10/2005 | Doi | H01L 21/6835 438/127 |
| 2006/0154393 A1* | 7/2006 | Doan | H01L 33/0079 438/26 |
| 2008/0166668 A1 | 7/2008 | You | |
| 2010/0186883 A1* | 7/2010 | Tomoda | H01L 25/0753 156/220 |
| 2012/0012760 A1 | 1/2012 | Lee | |
| 2012/0295376 A1* | 11/2012 | Lee | A61N 5/0622 438/28 |
| 2012/0313341 A1* | 12/2012 | Mills | A61G 5/045 280/124.128 |
| 2013/0026511 A1* | 1/2013 | Yeh | H01L 25/0753 257/89 |
| 2014/0159065 A1* | 6/2014 | Hu | H01L 24/95 257/88 |
| 2014/0159066 A1* | 6/2014 | Hu | H01L 25/0753 257/88 |
| 2015/0076528 A1* | 3/2015 | Chan | H01L 27/156 257/88 |
| 2015/0111329 A1* | 4/2015 | Wu | H01L 33/0095 438/28 |
| 2015/0155445 A1 | 6/2015 | Zhan et al. | |
| 2016/0072012 A1* | 3/2016 | Chen | H01L 33/145 257/101 |
| 2016/0155892 A1* | 6/2016 | Li | H01L 24/00 257/89 |
| 2016/0181476 A1* | 6/2016 | Chang | H01L 25/0753 257/13 |
| 2016/0240516 A1* | 8/2016 | Chang | H01L 25/0753 |
| 2016/0336304 A1* | 11/2016 | Wu | H01L 21/6835 |
| 2017/0162552 A1* | 6/2017 | Thompson | H01L 25/167 |
| 2017/0183767 A1 | 6/2017 | Hong | |
| 2017/0227816 A1* | 8/2017 | Jansen | G02F 1/133603 |
| 2017/0236811 A1* | 8/2017 | Pokhriyal | H01L 21/67144 257/91 |
| 2017/0256522 A1* | 9/2017 | Cok | H01L 25/0753 |
| 2017/0263811 A1* | 9/2017 | Zou | H01L 25/0753 |
| 2017/0278760 A1* | 9/2017 | Chen | H01L 21/67144 |
| 2017/0301660 A1* | 10/2017 | Pokhriyal | H01L 21/6835 |
| 2017/0330857 A1* | 11/2017 | Zou | H01L 33/62 |
| 2017/0330867 A1* | 11/2017 | Zou | H01L 25/0753 |
| 2017/0338199 A1* | 11/2017 | Zou | H01L 24/81 |
| 2017/0338374 A1* | 11/2017 | Zou | H01L 33/0079 |
| 2017/0373046 A1* | 12/2017 | Gardner | H01L 25/0753 |
| 2018/0053751 A1* | 2/2018 | Zou | H01L 33/0079 |
| 2018/0069149 A1* | 3/2018 | Zou | H01L 21/68 |
| 2018/0114878 A1* | 4/2018 | Danesh | H01L 33/32 |
| 2018/0130779 A1* | 5/2018 | Pokhriyal | H01L 21/6835 |
| 2018/0175262 A1* | 6/2018 | Jansen | H01L 33/58 |
| 2018/0219123 A1* | 8/2018 | Wang | H01L 27/156 |
| 2018/0247922 A1* | 8/2018 | Robin | H01L 25/167 |
| 2018/0261582 A1* | 9/2018 | Henry | H01L 25/167 |

FOREIGN PATENT DOCUMENTS

| | | | | |
|---|---|---|---|---|
| CN | 1797713 A | 7/2006 | | |
| CN | 1831588 A | 9/2006 | | |
| CN | 1992167 A | 7/2007 | | |
| CN | 101582385 A | 11/2009 | | |
| CN | 101859728 A | 10/2010 | | |
| CN | 102063011 A | 5/2011 | | |
| CN | 102339738 A | 2/2012 | | |
| CN | 104846331 A | 8/2015 | | |
| CN | 105493297 A | 4/2016 | | |
| CN | 105493298 A | 4/2016 | | |
| CN | 105870265 A | 8/2016 | | |
| JP | 2010-177390 | * | 8/2010 | H01L 33/48 |
| WO | WO 2018/035668 | * | 3/2018 | H01L 33/00 |

OTHER PUBLICATIONS

First Chinese Office Action dated Jul. 4, 2017.
Second Chinese Office dated Jan. 10, 2018.

* cited by examiner

US 10,396,237 B2

LIGHT-EMITTING DIODE SUBSTRATE AND MANUFACTURING METHOD THEREOF, AND DISPLAY DEVICE

TECHNICAL FIELD

At least one embodiment of the present disclosure relates to a light-emitting diode substrate and a manufacturing method thereof, and a display device.

BACKGROUND

As compared with a liquid crystal display (LCD) and an organic light-emitting diode (OLED) display, an inorganic micro-scale light-emitting diode display has higher brightness, faster response, wider applicable temperature, longer service life, and lower power consumption expected. For example, the inorganic micro-scale light-emitting diode can include an inorganic micro-scale light-emitting diode based on Group III-V. With Sony's exhibition of a 55-inch full high definition (FHD) light-emitting diode television, and Apple's acquisition of LuxVue, a micro-scale light-emitting diode display technology has received more attention in the past two years. Industry insiders give a high degree of evaluation of the technology, and refer to it as a next generation of display technology having a potential of subverting a display industry framework.

SUMMARY

At least one embodiment of the present disclosure provides a light-emitting diode substrate and a manufacturing method thereof, and a display device, so as to better transfer light-emitting diode (LED) units from a supporting substrate onto a receiving substrate.

At least one embodiment of the present disclosure provides a manufacturing method of a light-emitting diode substrate, including: disposing a supporting substrate supporting a plurality of light-emitting diode units to be opposed to a receiving substrate so that a side of the supporting substrate facing the receiving substrate supports the plurality of light-emitting diode units; and irradiating a side of the supporting substrate away from the receiving substrate with laser, stripping the light-emitting diode units from the supporting substrate, and transferring the light-emitting diode units onto the receiving substrate.

At least one embodiment of the present disclosure provides a light-emitting diode substrate, formed by using the method provided by at least one embodiment of the present disclosure.

At least one embodiment of the present disclosure provides a display device, including the light-emitting diode substrate provided by at least one embodiment of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE NUMERALS

Figure 1A:
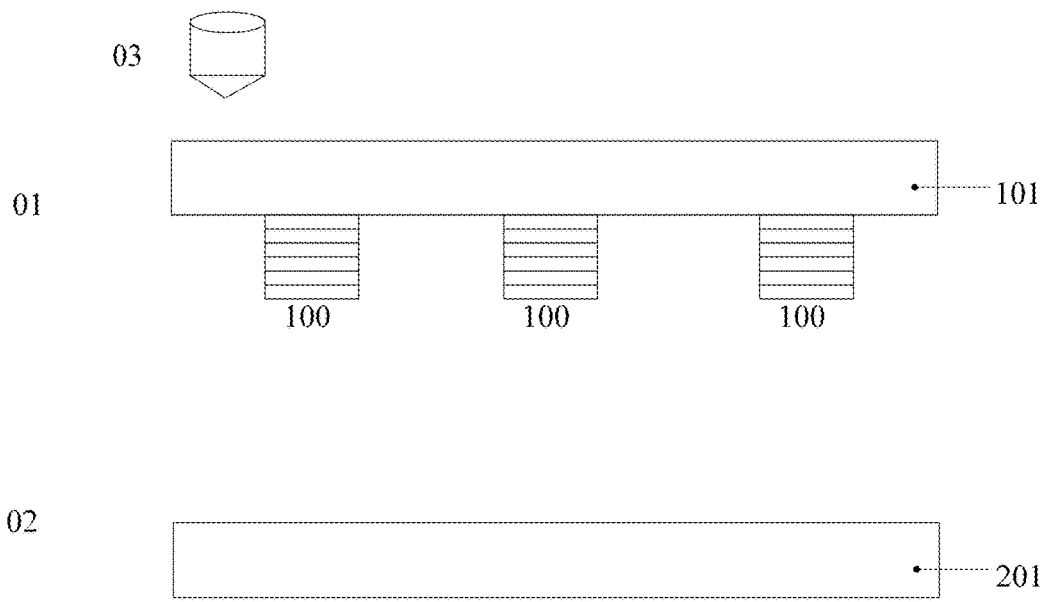
FIG. 1a is a schematic diagram of a manufacturing method of a light-emitting diode substrate (before laser irradiation) provided by an embodiment of the present disclosure.

100—light-emitting diode unit; 01—supporting substrate; 02—receiving substrate; 04—mask; 05—carrier substrate; 06—pressurizing substrate; 07—encapsulation substrate; 08—photo spacer; 09—encapsulation material; 101—first base substrate; 102—buffer layer; 103—N-type doped semiconductor layer; 104—light-emitting layer; 105—P type doped semiconductor layer; 106—current dispersion layer; 107—bonding layer; 200—sub-pixel region; 201—second base substrate; 202—pixel definition layer; 203—solder point; 204—reflective layer; 205—planarization layer; 2051—via hole; 206—second electrode; 223—auxiliary metal region; 211—gate electrode; 212—gate insulating layer; 213—active layer; 214—source electrode; 215—drain electrode; 216—first electrode; 217—via hole; 12345—thin film transistor; 207—insulating protective layer; 345—light-emitting stacked layer; 401—opening; 402—alignment mark; 701—black matrix; 221—red sub-pixel; 222—green sub-pixel; 224—blue sub-pixel.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but can include an electrical connection, directly or indirectly. "On," "under," "right," "left" and the like are only used to indicate relative position relationship, and when the position of the object which is described is changed, the relative position relationship can be changed accordingly.

An inorganic micro-scale light-emitting diode unit requires a more stringent manufacturing condition, and generally, needs to be obtained by epitaxial growth in a high-temperature condition on a substrate such as sapphire or SiC. When a display product is being manufactured, how to transfer and integrate the inorganic micro-scale light-emitting diode unit onto a TFT array substrate is a primary problem about which researchers are concerned. Reported methods include solutions of transfer head transfer and fluid guidance. LuxVue (US20150021466A1) and Sony (U.S. Pat. No. 6,961,993B2) employ a one-step or two-step transfer method, wherein, a light-emitting diode unit is transferred from a wafer substrate to a TFT array substrate by a transfer head. Although it is said that the transfer head can transfer tens of thousands of light-emitting diodes each time, with respect to a display device with a resolution of full high definition (FHD) and above, the number of the light-emitting diode unit can be as many as millions or tens of millions, and a small panel needs dozens or hundreds of times of transfer. Sharp Corporation (US20150155445A1) delivers a sheet-like light-emitting diode unit to a corresponding sub-pixel region in a TFT array substrate in a mode of the fluid guidance; each of the sub-pixel regions is provided with a via hole, and is connected with a suction pump therebelow, at the same time when fluid is delivering the micro-scale light-emitting diode unit, the suction pump is turned on, which facilitates assisting the light-emitting diode unit to reach the sub-pixel region, and it is a difficult point in the method to deliver the light-emitting diode unit highly efficiently to the sub-pixel region in a correct direction. These two methods have a difficulty to guarantee a yield, they take a long time for a transfer process, and their cost is also higher. Therefore, a highly efficient transfer process of the inorganic micro-scale light-emitting diode unit is needed.

Figure 1B:
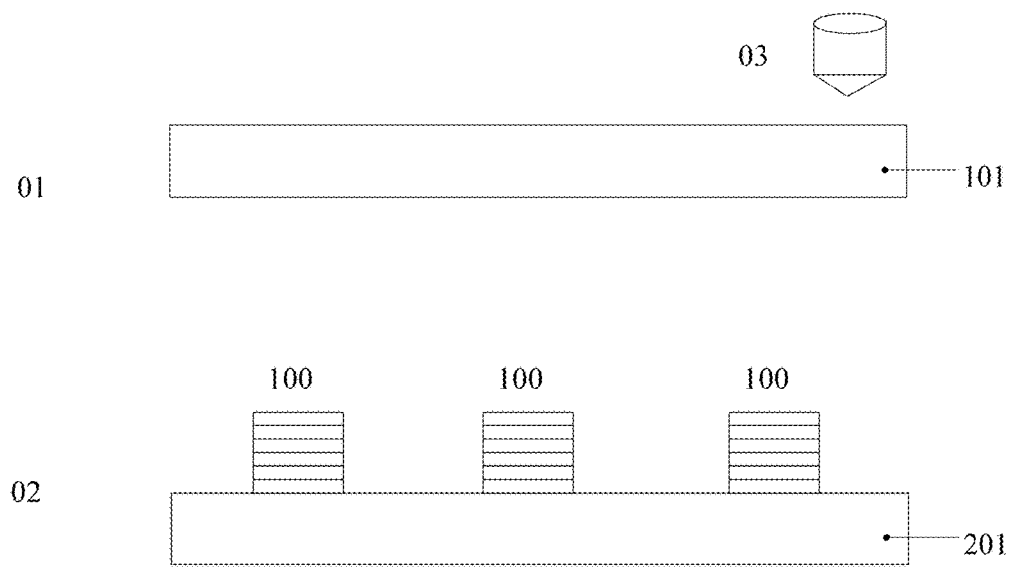
FIG. 1b is a schematic diagram of the manufacturing method of a light-emitting diode substrate (after laser irradiation) provided by an embodiment of the present disclosure.

An embodiment of the present disclosure provides a manufacturing method of a light-emitting diode (LED) substrate, and as illustrated in FIG. 1a and FIG. 1b, the method for manufacturing the LED substrate is as follows:

Firstly, disposing a supporting substrate 01 supporting a plurality of LED units 100 to be opposed to a receiving substrate 02, a side of the supporting substrate 01 facing the receiving substrate 02 supports the plurality of LED units 100;

Next, irradiating a side of the supporting substrate 01 away from the receiving substrate 02 with laser, stripping the LED units 100 from the supporting substrate 01, and transferring the LED units onto the receiving substrate 02.

For example, as illustrated in FIG. 1a and FIG. 1b, the laser is provided by a laser device, and a laser head 3 of the laser device is provided on the side of the supporting substrate 01 away from the receiving substrate 02. For example, the laser head 3 can move from one side of the supporting substrate 01 to the other side, and the LED units 100 are stripped from the supporting substrate 01 by high-energy laser. It should be noted that, a manner of laser irradiation is not limited to that as given above. In the embodiment of the present disclosure, there can be various types of laser devices, for example, a solid-state laser device, a gas laser device, an excimer laser device, a semiconductor laser device, and the like. It should be noted that, in the embodiment of the present disclosure, the laser device used is not limited.

For example, the manufacturing method of the LED substrate provided by the embodiment of the present disclosure can be used for manufacturing a display substrate, and is particularly suitable for manufacturing a small-and-medium-sized display used in a mobile product and a wearable product, which facilitates reducing costs and enhancing transfer and integration efficiency.

Figure 2A:
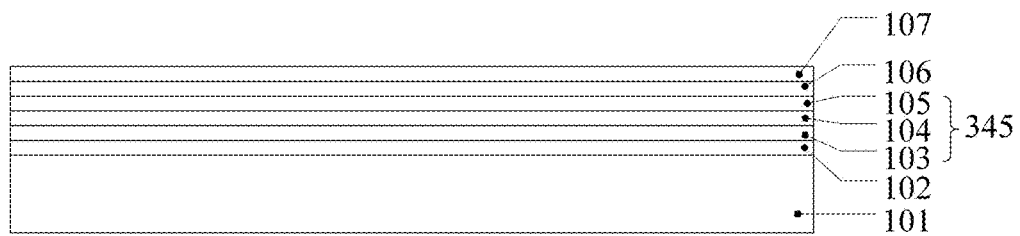
FIG. 2a is a schematic diagram of a supporting substrate (before etching) provided by an embodiment of the present disclosure.
Figure 2B:
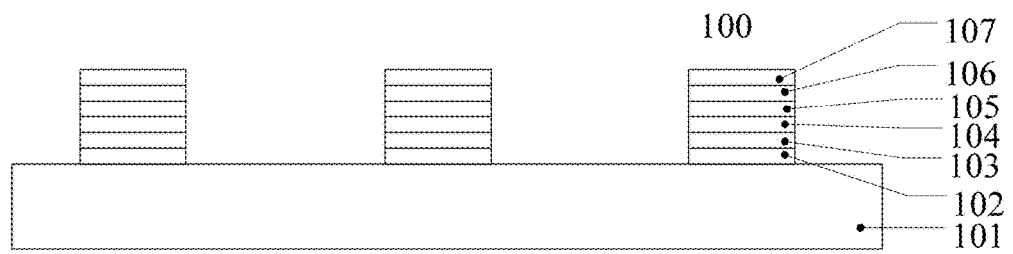
FIG. 2b is a schematic diagram of a supporting substrate (after etching) provided by an embodiment of the present disclosure.

For example, FIG. 2a and FIG. 2b are schematic diagrams of the LED units 100 on the first base substrate 101 (wafer substrate) before and after etching provided by the embodiment of the present disclosure. For example, a light-emitting stacked layer 345 is provided on the first base substrate 101, and a current dispersion layer 106 and a bonding layer 107 are provided on the light-emitting stacked layer 345. That is, each of the LED units 100 include a light-emitting stacked layer 345, a current dispersion layer 106 and a bonding layer 107; and the bonding layer 107 can be configured to be in contact with and bonded to the receiving substrate 02. In some examples, the light-emitting stacked layer 345 can include an N-type doped semiconductor layer 103 and a P-type doped semiconductor layer 105, as well as a light-emitting layer 104 provided between the N-type doped semiconductor layer 103 and the P-type doped semiconductor layer 105. In some examples, a buffer layer 102 can be further provided between the light-emitting stacked layer 345 and the first base substrate 101, and further, for example, the buffer layer 102 is an N-type semiconductor buffer layer. It should be noted that, in the embodiment of the present disclosure, each of the LED units can also not include the current dispersion layer 106 and/or the bonding layer 107, which is not limited by the embodiment of the present disclosure.

For example, the first base substrate 101 can be sapphire, silicon carbide, gallium arsenide, and the like. The light-emitting layer 104 can be a single-layer or a multi-layer quantum well light-emitting layer. The current dispersion layer 106 is configured to disperse current, which has a certain protective effect on the LED unit, and at the same time makes better contact between the LED unit and the receiving substrate. The bonding layer 107 can be a material with high temperature resistance and good conductivity, and can be bonded to the receiving substrate after the LED units are transferred onto the receiving substrate. For example, the current dispersion layer should have good transmittance, and the bonding layer should have a certain reflective effect, in order to improve light emission efficiency of an LED device. Dry etching can be performed to obtain a patterned wafer structure as illustrated in FIG. 1b, and obtained the plurality of LED units on the wafer substrate.

There are also various options for the N-type doped layer, the P-type doped layer and the light-emitting layer. For example, a light-emitting layer material of a red light device can be selected from one or more of materials of AlGaAs, GaAsP, GaAsP, GaP, and other materials, a light-emitting layer material of a green light device can be selected from one or more of materials of InGaN, GaN, GaP, AlGaP, and other materials, and a light-emitting layer material of a blue light device can be selected from one or more of materials of GaN, InGaN, ZnSe, and other materials. For example, the light-emitting layer material can be doped, to form the N-type doped layer or the P-type doped layer. The N-type doped layer or the P-type doped layer can be obtained by N-type doping (e.g., silicon (Si) doping) or P-type doping (e.g., magnesium (Mg) doping) in one or more light-emitting layer materials. A thickness of each of the LED units can be 3 μm to 50 μm or more; the current dispersion layer 106 can be a single-layer or a multi-layer metal, oxide or polymer, etc. with good electrical conductivity and thermal conductivity, and its thickness can be 0.1 μm to 3 μm. A material of the bonding layer 107 can be a metal with a melting point higher than 300° C., e.g., gold, copper, aluminum, zinc, nickel, etc., or an alloy thereof, and its thickness is 0.5 μm to 3 μm. It should be noted that, in the embodiment of the present disclosure, options of the materials of the N-type doped layer, the P-type doped layer and the light-emitting layer in each of the LED units are not limited to the cases as exemplified above, and can be selected with reference to a conventional design.

It should be noted that, the above is merely exemplary and does not limit a layer structure of the LED unit, and other structures or other materials can also be used in the LED unit in the embodiment of the present disclosure, which is not limited here.

Figure 3A:
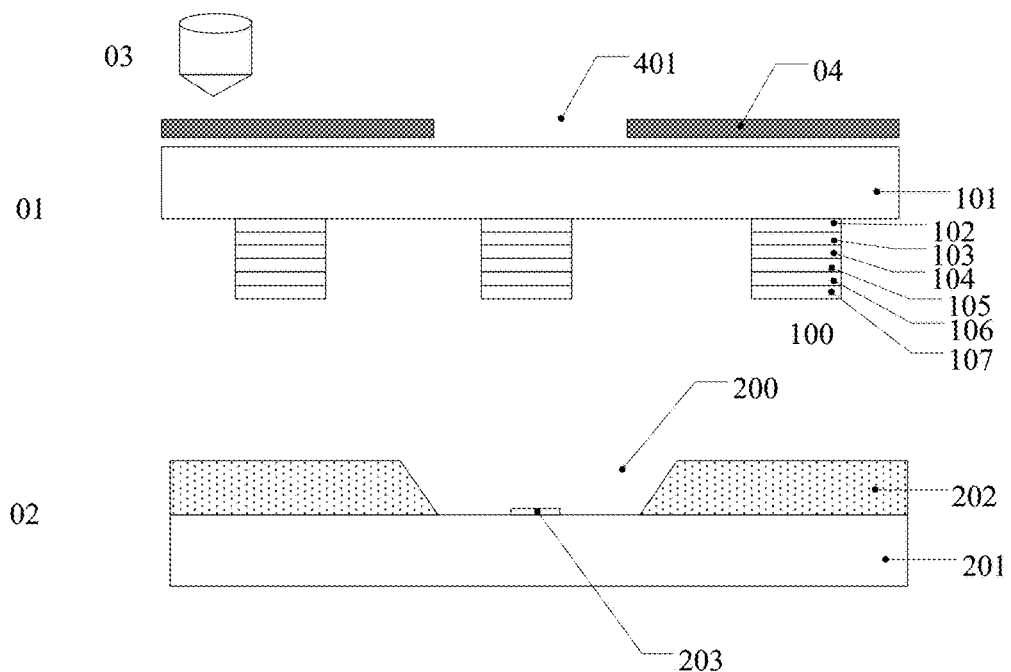
FIG. 3a is a schematic diagram of another manufacturing method of a light-emitting diode substrate (before laser irradiation) provided by an embodiment of the present disclosure.
Figure 3B:
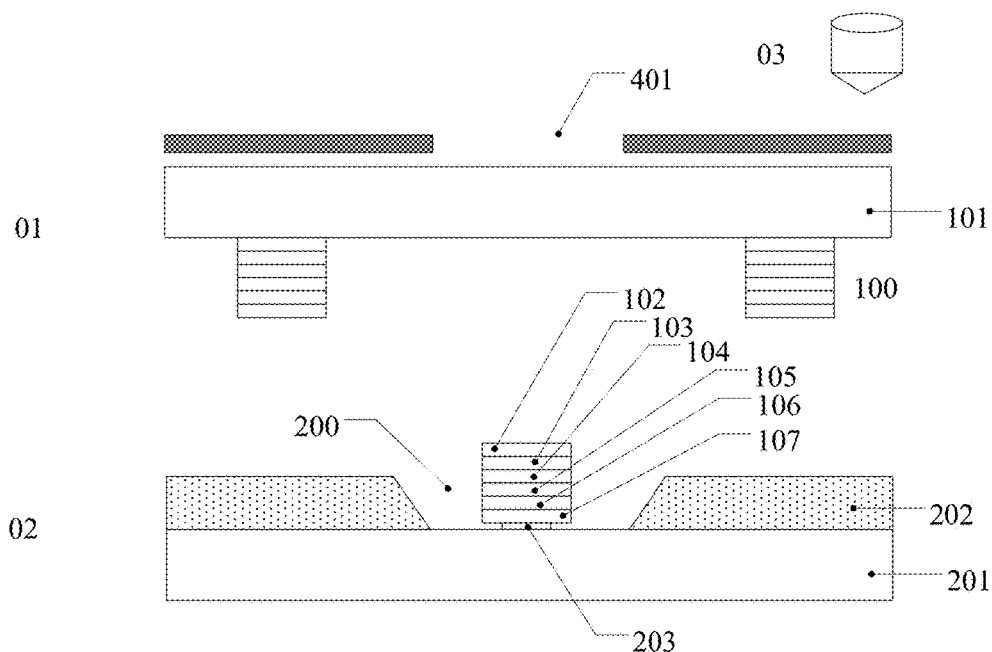
FIG. 3b is a schematic diagram of another manufacturing method of a light-emitting diode substrate (after laser irradiation) provided by an embodiment of the present disclosure.

In some examples, as illustrated in FIG. 3a and FIG. 3b, in order to selectively strip the LED units, a mask 04 is also provided on the side of the supporting substrate 01 away from the receiving substrate 02, the mask 04 is provided with a plurality of openings 401 therein; the laser irradiates a side of the mask 04 away from the supporting substrate 01, to strip the LED units 100 corresponding to positions of the plurality of openings 401 of the mask 04 from the supporting substrate 01, and transfer the LED units stripped away onto the receiving substrate 02.

As illustrated in FIG. 3a and FIG. 3b, a patterned mask 04 is provided between the laser head 3 and the supporting substrate 01. When the laser is scanning, only the LED units corresponding to positions of the openings on the mask will be stripped, laser in other position will be shielded by the mask, so that the laser will not affect the LED units shielded by the mask. The embodiment of the manufacturing method of the LED substrate includes a micro-scale LED unit transfer process, which selectively transfer designated LED units to the receiving substrate, by using a laser stripping technology, with a mask, so that utilization rate and transfer efficiency of the LED units can be improved.

For example, the receiving substrate 02 includes a second base substrate 201. For example, the second base substrate 201 can include a glass substrate, a flexible substrate, and the like, which is not limited here. For example, the receiving substrate 02 can be a TFT array substrate. Because the LED unit and an OLED unit have a very similar display principle, a drive circuit design solution similar to that of an OLED can be used, for example, a simplest 2T1C or 4T2C, 6T2C, 7T1C, etc. with a compensation function can be used, but is not limited thereto. A selected drive circuit is not limited in the embodiment of the present disclosure.

In some examples, as illustrated in FIG. 3a and FIG. 3b, the receiving substrate 02 is provided thereon with a pixel definition layer 202, the pixel definition layer 202 defines a plurality of sub-pixel regions 200, each of the sub-pixel regions 200 is configured to receive at least one of the LED units 100; and the sub-pixel region 200 is a micro-scale receiving hole, which facilitates accurate integration of the micro-scale LED unit into a designated region. A solder point 203 can be provided in a position where the at least one of the LED units 100 is received within each of the sub-pixel regions 200. For example, the bonding layer 107 in each of the LED units can be a material with high temperature resistance and good conductivity, and can be bonded to the solder point after the LED unit is transferred onto the receiving substrate.

For example, a material used in the solder point is a solder material, for which a low-temperature solder material (with a melting point below 300° C.) can be selected, which is, for example, indium, tin, or indium tin material mixed with a soldering flux. In some examples, a projection of each of the LED units 100 on the receiving substrate 02 covers a projection of a solder point 203 corresponding thereto on the receiving substrate 02. For example, a diameter of the solder point can be about ½ of a diameter of each of the LED units, and a thickness of the solder point can be 0.05 μm to 1.0 μm, as long as its coverage during melting can be smaller than or equal to a diameter of each of the LED units. For example, the thickness of the solder point is not greater than a thickness of the bonding layer 107 in each of the LED units, in order to better achieve the above-described effect that the coverage of the solder point during melting is smaller than or equal to the diameter of the each of the LED units.

For example, a thickness of the pixel definition layer can be adjusted according to the thickness of each of the LED units, and its thickness a thickness of the pixel definition layer can be 1 μm to 50 μm, and the pixel definition layer can be fabricated by spin coating, printing, and so on. By adjusting an inclination angle of an inner edge of a pixel, a viewing angle and a light emission effect can be adjusted. In some examples, as illustrated in FIG. 3b, the thickness of the pixel definition layer 202 is smaller than the thickness of each of the LED units 100, in order to facilitate reduction of a distance between the supporting substrate and the receiving substrate, and improvement of transfer and reception success rate of the LED units.

Figure 3C:
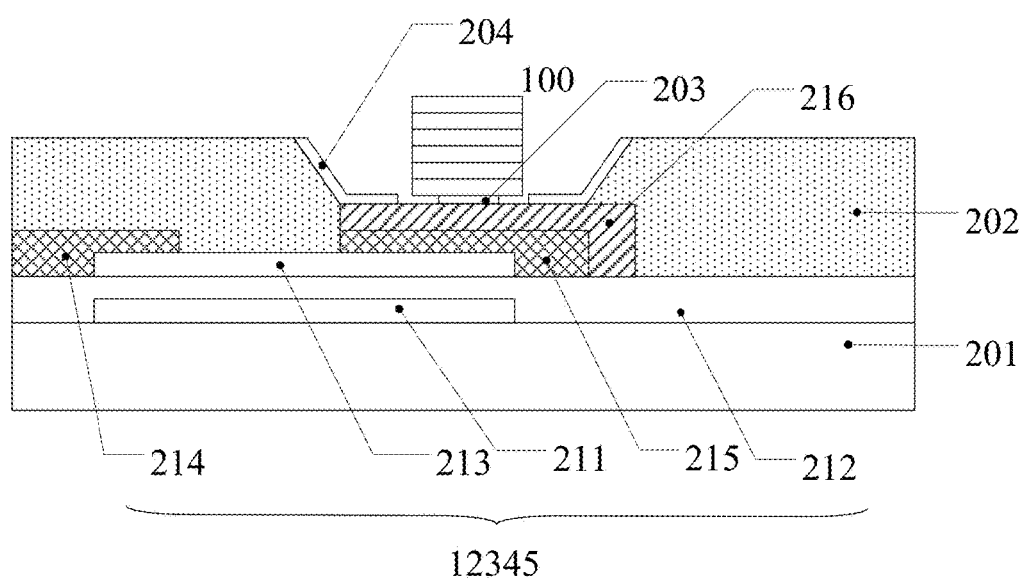
FIG. 3c is a schematic diagram of an LED unit being electrically connected with a first electrode, and the first electrode being electrically connected with a drain electrode of a thin film transistor (a reflective layer being not electrically connected with a solder point) in a manufacturing method of a light-emitting diode substrate provided by an example of the embodiment of the present disclosure.
Figure 3D:
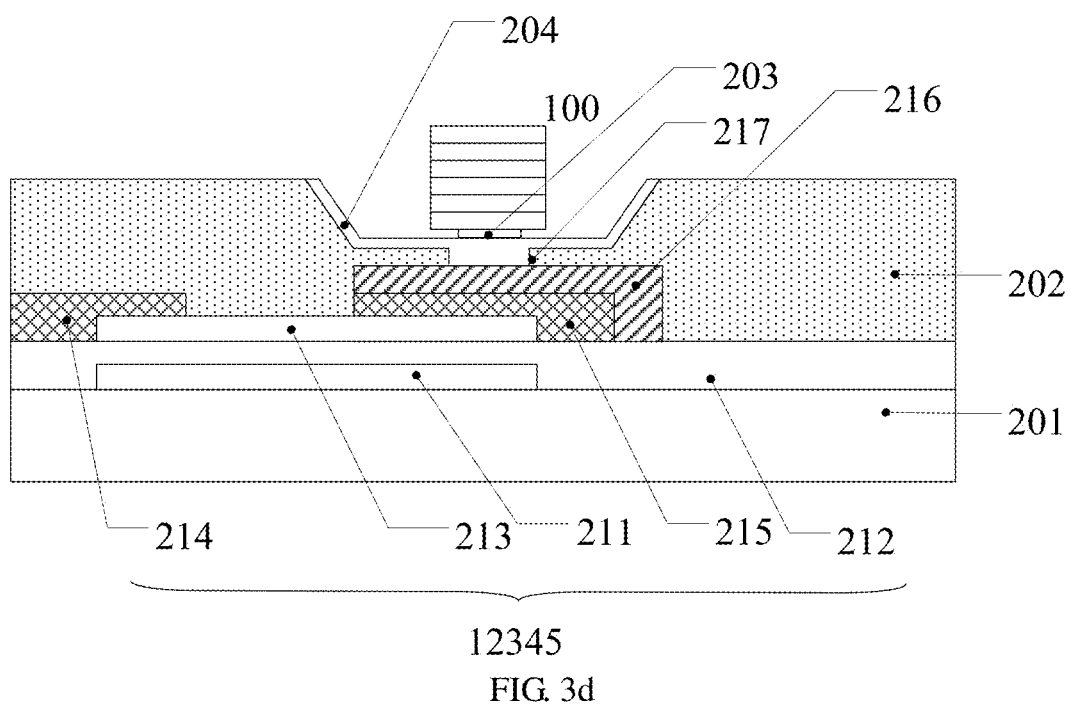
FIG. 3d is a schematic diagram of the LED unit being electrically connected with the first electrode, and the first electrode being electrically connected with the drain electrode of a thin film transistor (the reflective layer being electrically connected with the solder point) in a manufacturing method of a light-emitting diode substrate provided by another example of the embodiment of the present disclosure.

In some examples, as illustrated in FIG. 3c and FIG. 3d, each of the sub-pixel regions 200 of the receiving substrate 02 is provided with a reflective layer 204. In some examples, as illustrated in FIG. 3c, the solder point 203 is located above the first electrode 216, the first electrode 216 is electrically connected with a drain electrode 215 of a thin film transistor 12345, and the LED unit 100 is electrically connected with the first electrode 216 via the solder point 203, a reflective layer 204 can be provided within the sub-pixel region, and the reflective layer 204 cannot be electrically connected with the solder point and the LED unit 100. In other examples, as illustrated in FIG. 3d, within each of the sub-pixel regions 200, a reflective layer 204 is electrically connected with the first electrode 216 on the receiving substrate 02. The first electrode 216 is electrically connected with a drain electrode 215 of a thin film transistor 12345. For example, the thin film transistor 12345 includes a gate electrode 211, a gate insulating layer 212, an active layer 213, a source electrode 214, and a drain electrode 215. The drain electrode 215 is electrically connected with the first electrode 216. A material of the first electrode 216 includes, for example, a transparent metal oxide, for example, indium tin oxide (ITO), but is not limited hereto. For example, each of the sub-pixel regions can be covered with one or more layers of metal or oxide with good conductive and reflective properties, a lower end of the reflective layer 204 can be electrically connected with the first electrode 216 through a via hole 217, to be further connected with the drain electrode 215 of the TFT which is a drive TFT, the reflective layer 204 can be made of a material of, for example: aluminum, molybdenum, titanium, titanium-aluminum-titanium, molybdenum-aluminum-molybdenum, ITO-silver-ITO and the like, and a thickness of the reflective layer 204 can be in a range of 0.1 μm to 3 μm.

Hereinafter, it is illustrated with a case where the reflective layer 204 is electrically connected with the solder point as an example.

Figure 3E:
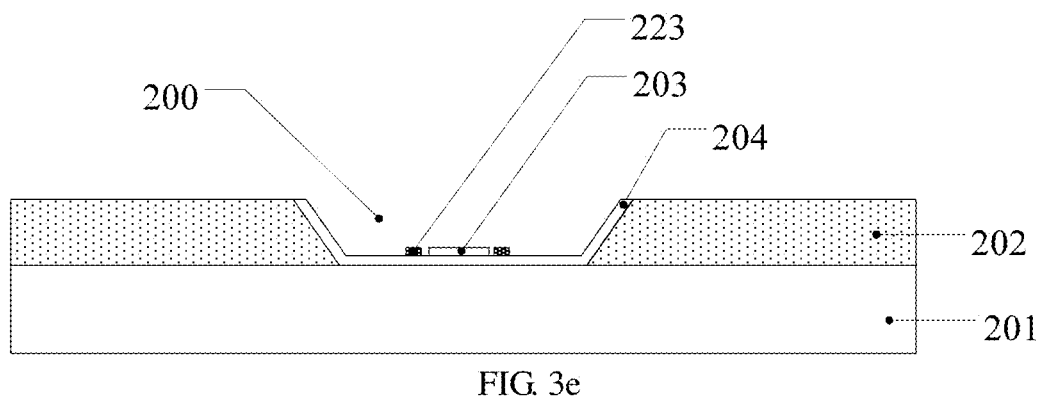
FIG. 3e is a schematic diagram of an auxiliary metal region being provided in a periphery of a solder point (before a receiving substrate receives an LED unit) in a manufacturing method of a light-emitting diode substrate provided by an embodiment of the present disclosure.
Figure 3F:
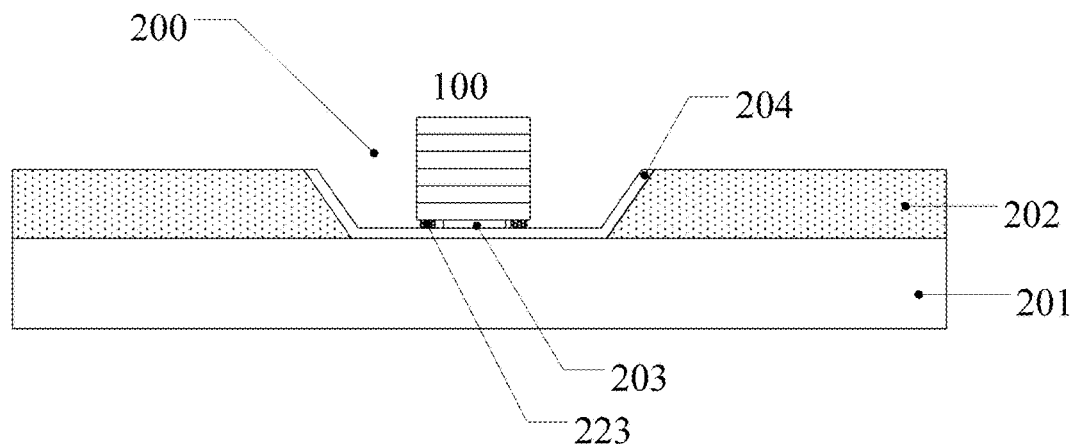
FIG. 3f is a schematic diagram of the auxiliary metal region being provided in a periphery of a solder point (after the receiving substrate receives the LED unit) in a manufacturing method of a light-emitting diode substrate provided by an embodiment of the present disclosure.
Figure 4A:
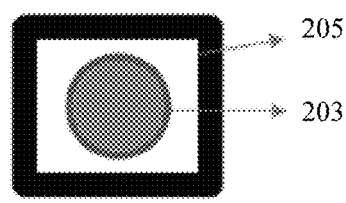
FIG. 4a is a schematic diagram of a solder point of a first type of shape and an auxiliary metal region in a manufacturing method of a light-emitting diode substrate provided by an embodiment of the present disclosure.
Figure 4B:
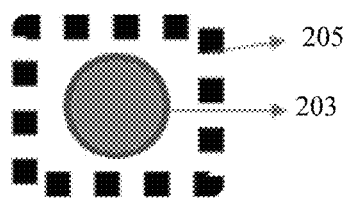
FIG. 4b is a schematic diagram of a solder point of a second type of shape and an auxiliary metal region in a manufacturing method of a light-emitting diode substrate provided by an embodiment of the present disclosure.
Figure 4C:
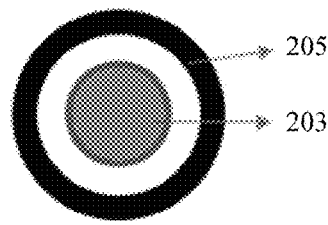
FIG. 4c is a schematic diagram of a solder point of a third type of shape and an auxiliary metal region in a manufacturing method of a light-emitting diode substrate provided by an embodiment of the present disclosure.
Figure 4D:
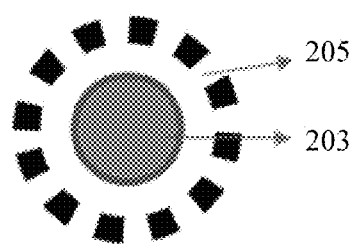
FIG. 4d is a schematic diagram of a solder point of a fourth type of shape and an auxiliary metal region in a manufacturing method of a light-emitting diode substrate provided by an embodiment of the present disclosure.

In some examples, as illustrated in FIG. 3e and FIG. 3f, within each of the sub-pixel regions 200, an auxiliary metal region 223 is provided in a periphery of the solder point 203, and the auxiliary metal region 223 is provided around the solder point 203. In some examples, a melting point of the auxiliary metal region 223 is higher than a melting point of the solder point 203, so that a molten solder point 20 can be defined within a range of the auxiliary metal region 223.

The auxiliary metal region 204 can be provided in the periphery of the solder point 203 within the sub-pixel region. When the LED unit is transferred to the molten solder point, a certain pressure is applied until the LED unit, e.g., its bonding layer 107 is in contact with the auxiliary metal region 223. For example, the melting point of the auxiliary metal region 204 is higher than that of the solder point, and a material whose electrical conductivity is better than that of the solder point can be selected as the auxiliary metal region 204, for example, copper, aluminum, silver, gold and the like. In some examples, the auxiliary metal region 223 includes a rectangle, a circle, or multiple dispersed points. For example, the auxiliary metal region 223 can be designed in a shape of a ring, a square, a lattice, and the like (as illustrated in FIG. 4a to FIG. 4d), and the shape of the auxiliary metal region 223 can be designed according to a shape of the LED unit. For example, an area enclosed by the auxiliary metal region 223 is 1 to 2 times the area of the LED unit. Advantages of the design are that: a solder metal can be limited within the auxiliary metal region, to improve a success rate of receiving and soldering the LED unit, and at the same time, a contact performance of the LED unit and the first electrode 216 (e.g., the first electrode can be a pixel electrode, and can be an anode) can be improved, so that the contact performance is better.

Hereinafter, the mask 04 will be further described.

(1) For example, for the mask 04, one or more layers of a material with good thermal conductivity, certain rigidity and toughness, and good stability at a high temperature can be selected. For example, a material of the mask 04 includes stainless steel, copper, or an alloy thereof. A graphite layer with good thermal conductivity can also be added into the mask. For example, a thickness of the mask is 0.02 mm to 1 mm. According to a size of the LED unit, a size of the opening 401 of the mask can be 5 µm to 100 µm.

Figure 5A:
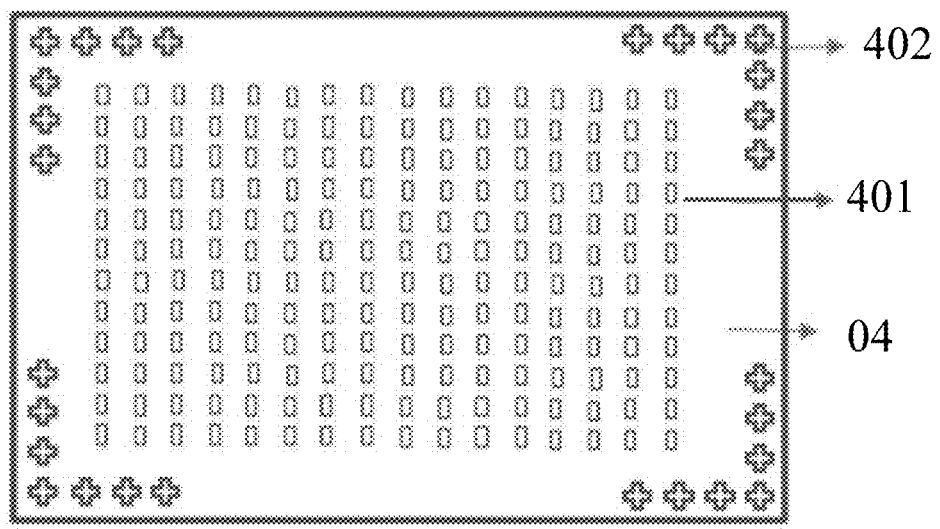
FIG. 5a is a schematic diagram of a mask in a manufacturing method of a light-emitting diode substrate provided by an embodiment of the present disclosure.

(2) In some examples, as illustrated in FIG. 5a, the plurality of openings 401 of the mask 04 are arranged in an array. In order to selectively strip the designated LED units, each of the openings can cover only one LED unit, or can cover more than one LED unit. When the laser scans in a horizontal direction or in a longitudinal direction, only the LED units corresponding to positions of the openings will be stripped, and laser at the other position will be shielded by the mask. An alignment mark 402 can be provided on the mask 04, so as to be used for performing an aligning operation at work.

Figure 5B:
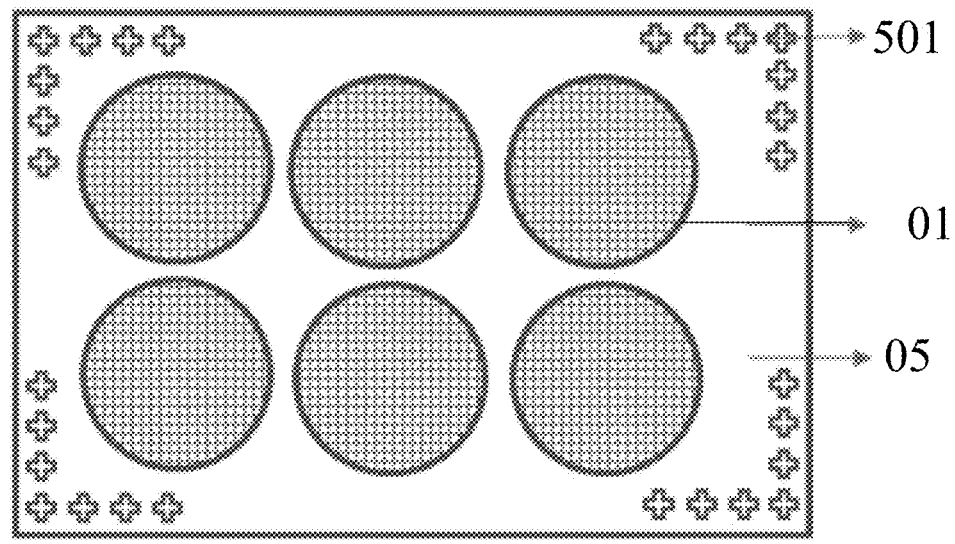
FIG. 5b is a schematic diagram of a carrier substrate for carrying a supporting substrate in a manufacturing method of a light-emitting diode substrate provided by an embodiment of the present disclosure.

A carrier substrate 05 for carrying the supporting substrate 01 is provided below the mask 04, as illustrated in FIG. 5b, and a movable clip can be provided here to fix the supporting substrate 01. In order to improve alignment accuracy, the alignment mark 501 can be provided on the carrier substrate 05 and the clip for carrying the supporting substrate 01, respectively. An arrangement effect of the supporting substrate 01 illustrated in FIG. 5b is only a schematic diagram, and a specific arrangement effect is determined with reference to a size of the supporting substrate and a size of the glass substrate. It should be noted that, the alignment mark 402 and the alignment mark 501 are cross-shaped in the diagram, but the embodiment of the present disclosure is not limited hereto.

For example, each of the openings of the mask corresponds to only one LED unit, and a distance between adjacent openings can be set according to a pixel spacing in a display panel; a distance between two openings can be equivalent to a distance of several LED units on the supporting substrate 01, e.g., 5 or more, essentially 3 to 10. After the laser has scanned the entire mask once, it is necessary to move the mask 04 and/or the supporting substrate 01 as a whole in a designated direction by a distance, which is equivalent to a distance of the LED units on the supporting substrate 01 with respect to each other. In order to ensure accurate alignment, the mask 04, the supporting substrate 01 and the receiving substrate 02 all need to be provided with a plurality of alignment marks, for example, a cross-shaped alignment mark can be provided, as illustrated in FIG. 5a and FIG. 5b. It is necessary to make a position at the alignment mark of the mask 04 and the supporting substrate 01 into an opening, for example, a width of each line of the cross shape is less than 3 µm, which can be adjusted according to requirement of alignment accuracy, and a distance between the alignment marks can be equal to a distance between adjacent LED units in the supporting substrate 01, or be an integral multiple of the distance between adjacent LED units in the supporting substrate 01.

In an initial aligning operation, alignment can be performed through four-corner alignment mark firstly. After the laser for stripping the LED units has scanned once, and the mask 04 and the supporting substrate 01 are moved, it is necessary to align by means of other alignment marks. During the alignment, a light source provided above the alignment mark of the mask is turned on, a photoreceptor can be provided at the alignment mark of the receiving substrate 02; only when the photoreceptor receives a signal sent by the light source in a designated region, it indicates successful alignment, and when deviation occurs, fine-tuning can be performed according to the signal of the light source for alignment.

Figure 5C:
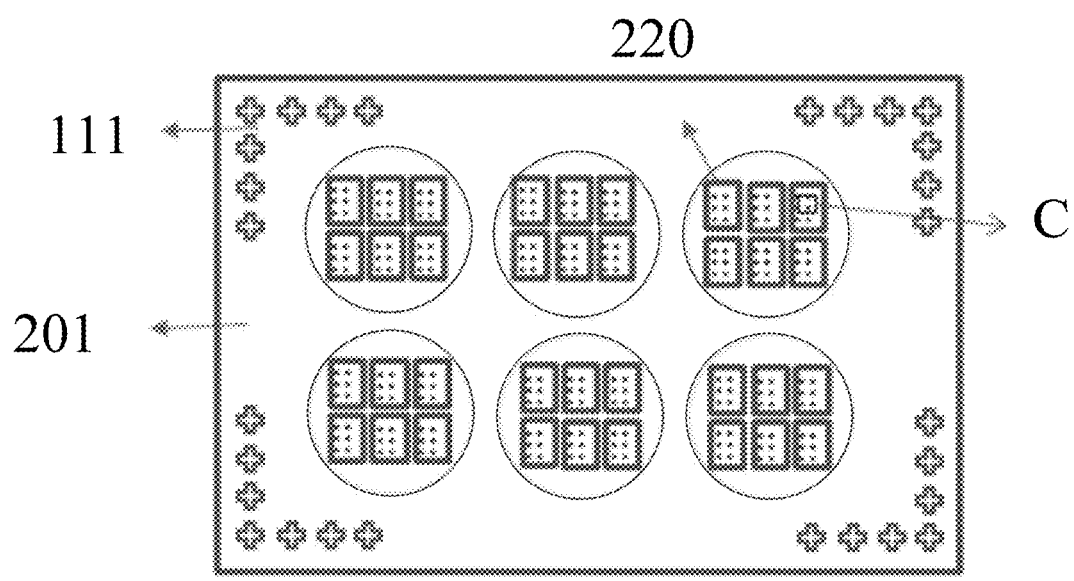
FIG. 5c is a schematic diagram of a receiving substrate after receiving the LED units in a manufacturing method of a light-emitting diode substrate provided by an embodiment of the present disclosure.
Figure 5D:
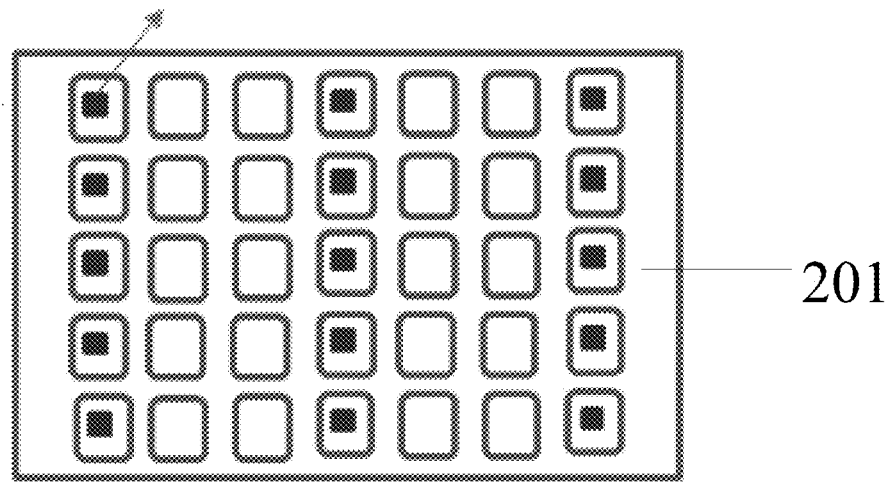
FIG. 5d is a schematic diagram of a receiving substrate after receiving red sub-pixels in a manufacturing method of a light-emitting diode substrate provided by an embodiment of the present disclosure.
Figure 5E:
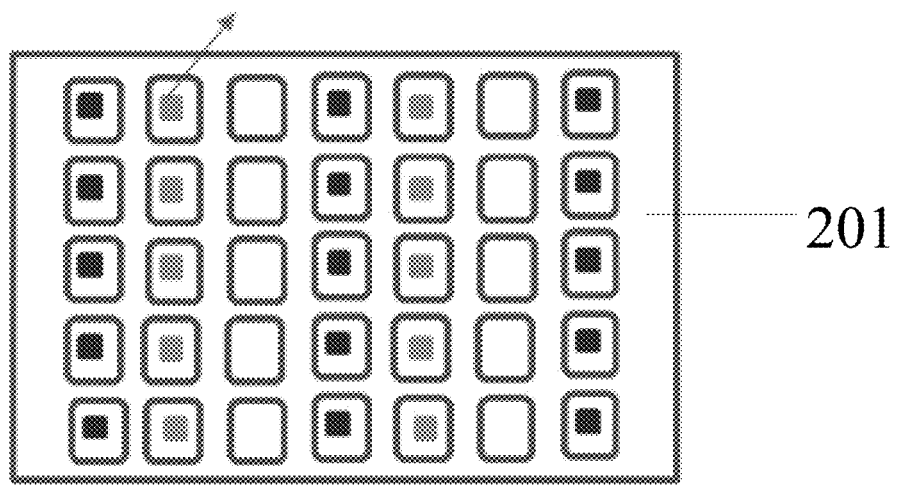
FIG. 5e is a schematic diagram of a receiving substrate after receiving green sub-pixels in a manufacturing method of a light-emitting diode substrate provided by an embodiment of the present disclosure.
Figure 5F:
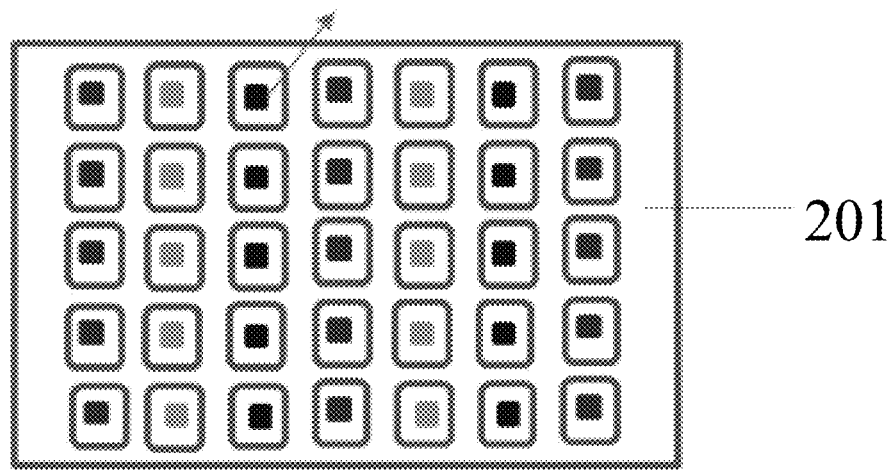
FIG. 5f is a schematic diagram of a receiving substrate after receiving blue sub-pixels in a manufacturing method of a light-emitting diode substrate provided by an embodiment of the present disclosure.

After the LED units are transferred onto the receiving substrate 02, as illustrated in FIG. 5c, a region 220 corresponding to a single display screen can be formed in a mode below. FIG. 5d to FIG. 5f illustrate an enlarged diagram of formation at C in FIG. 5c. For example, red sub-pixels 221 can be formed with the mask 04 firstly, then the mask 04 or the supporting substrate 01 is moved, green sub-pixels 222 are formed, then the mask 04 or the supporting substrate 01 is moved again, and blue sub-pixels 224 are formed. Each of the sub-pixel regions is provided with an LED unit. Sub-pixels of different colors can be transferred with a same mask, which can save costs of the mask. It should be noted that, a color of the sub-pixel formed and an order for forming the sub-pixels is not limited in the embodiment of the present disclosure.

Figure 6A:
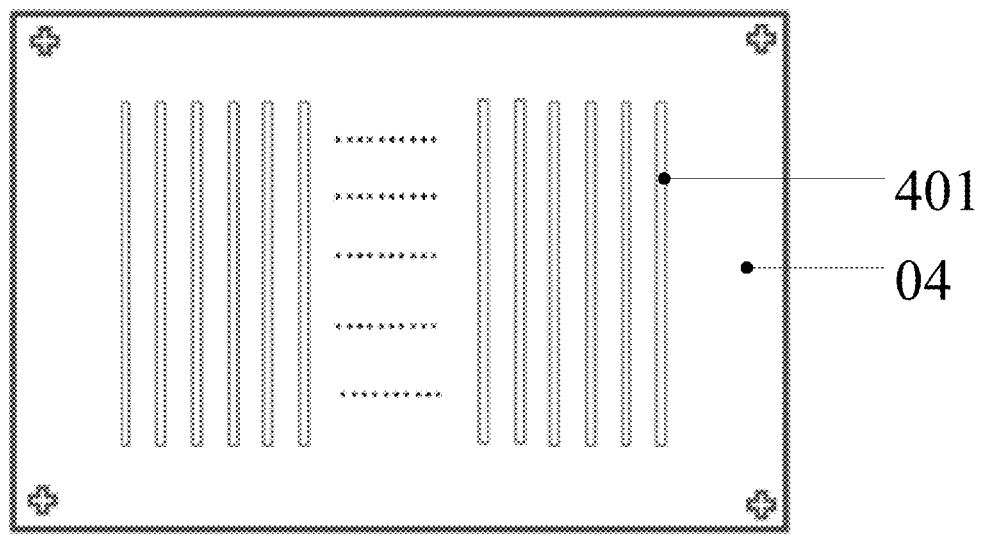
FIG. 6a is a schematic diagram of another mask in a manufacturing method of a light-emitting diode substrate provided by an embodiment of the present disclosure.
Figure 6B:
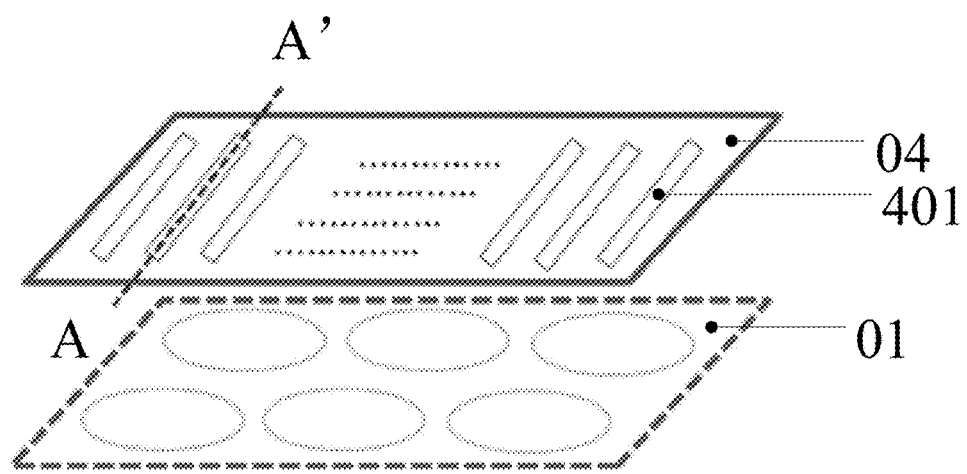
FIG. 6b is a schematic diagram of another carrier substrate for carrying a supporting substrate in a manufacturing method of a light-emitting diode substrate provided by an embodiment of the present disclosure.
Figure 6C:
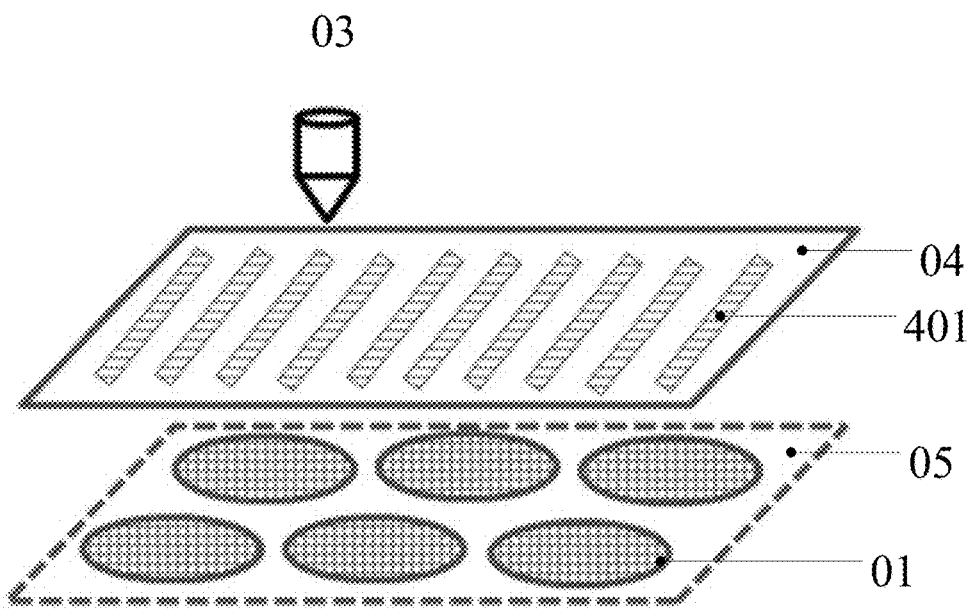
FIG. 6c is a schematic diagram of another manufacturing method of a light-emitting diode substrate provided by an embodiment of the present disclosure.

(3) In some examples, as illustrated in FIG. 6a, FIG. 6b and FIG. 6c, the plurality of openings 401 of the mask 04 are arranged in parallel.

Figure 6D:
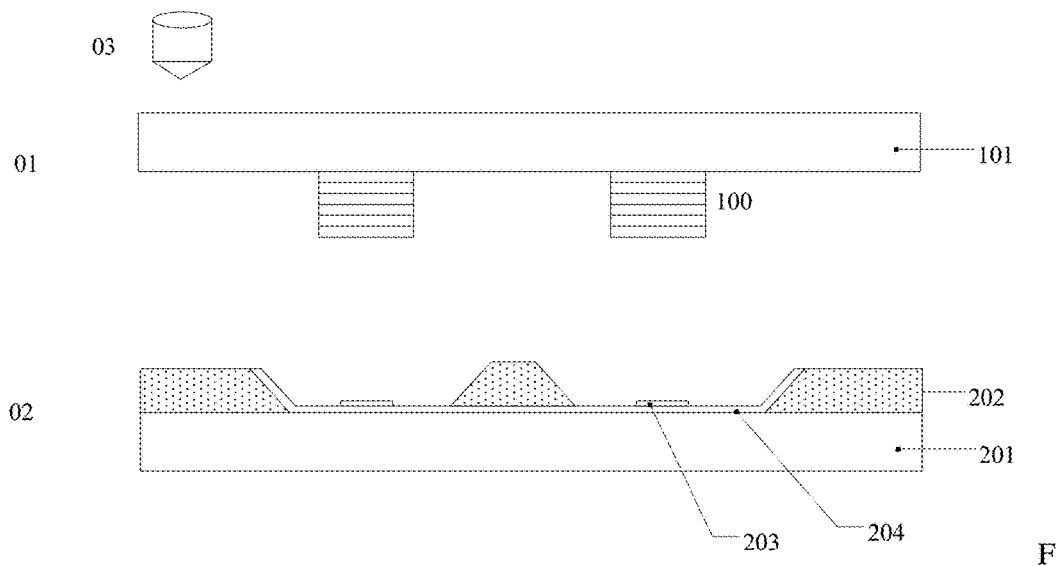
FIG. 6d is a schematic diagram at openings of a mask arranged in parallel in a manufacturing method of a light-emitting diode substrate provided by an embodiment of the present disclosure (a cross-sectional view of the supporting substrate and the receiving substrate corresponding to a mask along A-A' direction in FIG. 6b, before laser irradiation)
Figure 6E:
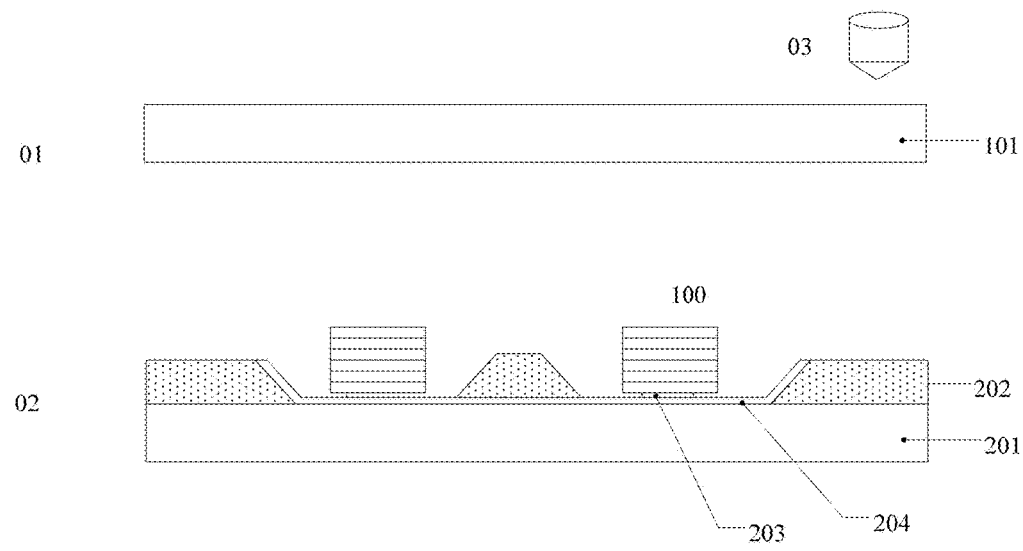
FIG. 6e is a schematic diagram at the openings of the mask arranged in parallel in a manufacturing method of a light-emitting diode substrate provided by an embodiment of the present disclosure (a cross-sectional view of the supporting substrate and the receiving substrate corresponding to the mask along A-A' direction in FIG. 6b, before laser irradiation)

In order to avoid moving the mask and the supporting substrate many times, when the supporting substrate 01 is being patterned, the distance between adjacent LED units can be made to be equal to the distance between adjacent sub-pixels in the receiving substrate 02, so that only linear openings needs to be made in the mask. As illustrated in FIG. 6*d* and FIG. 6*e*, when the laser has scanned the supporting substrate, the corresponding LED units has been transferred.

(4) In some examples, each of the openings 401 in the mask 04 corresponds to at least one of the LED units 100. In FIG. 5*a* and FIG. 5*b*, each opening 401 on the mask 04 corresponds to one LED unit 100.

Figure 7A:
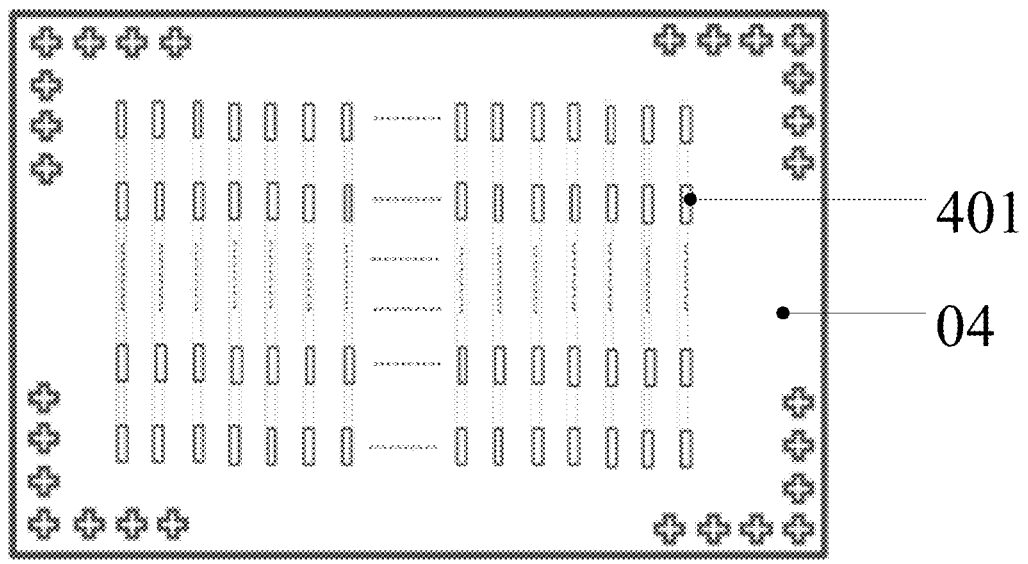
FIG. 7a is a schematic diagram of a mask having an opening of the mask corresponding to two LED units in a manufacturing method of a light-emitting diode substrate provided by an embodiment of the present disclosure.
Figure 7B:
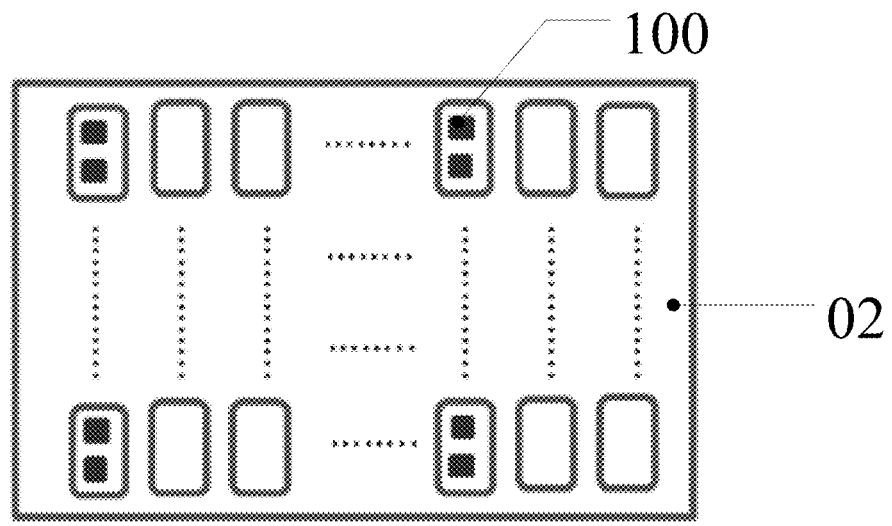
FIG. 7b is a schematic diagram of a sub-pixel region in a receiving substrate receiving two LED units in a manufacturing method of a light-emitting diode substrate provided by an embodiment of the present disclosure.
Figure 7C:
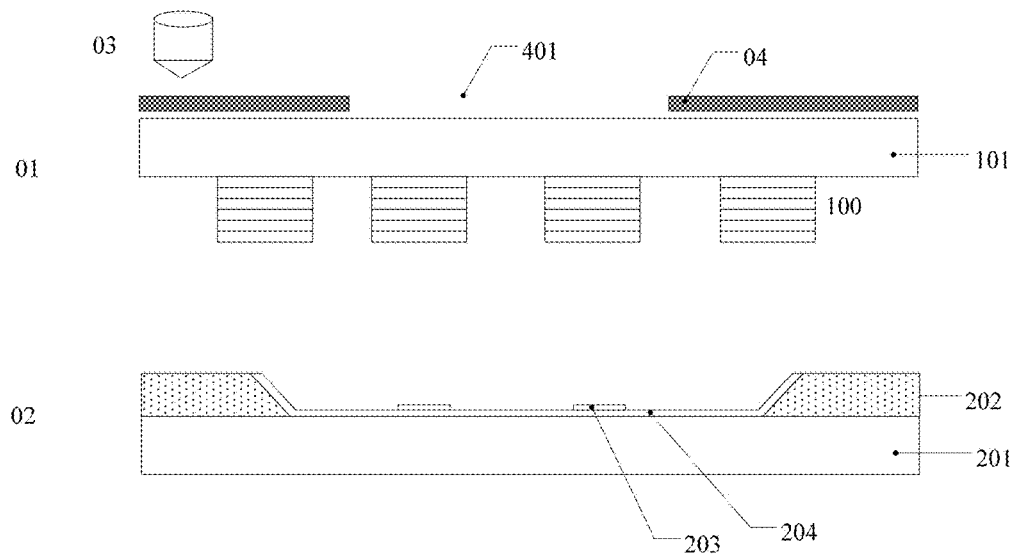
FIG. 7c is a schematic diagram of a mask having an opening corresponding to two LED units in a manufacturing method of a light-emitting diode substrate provided by an embodiment of the present disclosure (before laser irradiation)
Figure 7D:
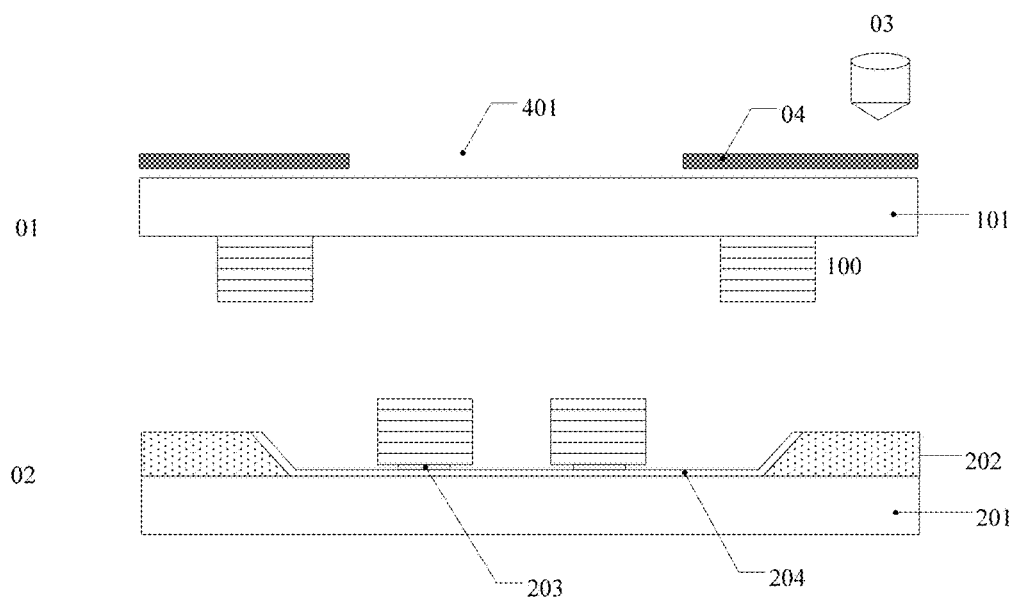
FIG. 7d is a schematic diagram of a mask having an opening corresponding to two LED units in a manufacturing method of a light-emitting diode substrate provided by an embodiment of the present disclosure (after laser irradiation)

In order to improve a yield of the display panel, two LED units can be provided within each of the sub-pixel regions, and are connected in parallel. In order to transfer the LED units more efficiently, as illustrated in FIG. 7*a*, each opening 401 on the mask 04 corresponds to two LED units 100. As illustrated in FIG. 7*b*, each of the sub-pixel region on the receiving substrate receives two LED units 100. As illustrated in FIG. 7*c* and FIG. 7*d*, when the laser has scanned one opening, two adjacent LED units will be stripped away.

It should be noted that, the number of the LED units 100 corresponding to each opening 401 in the mask 04 is not limited to the above description, but can be more than two. A shape of the opening 401 of the mask 04 is not limited to the above description, neither.

In the embodiment of the present disclosure, the number of pixels transferred can be adjusted by adjusting opening design of the mask. It is possible to integrate the LED units onto the receiving substrate more efficiently, and to manufacture the micro-scale LED display with a lower cost.

Figure 8A:
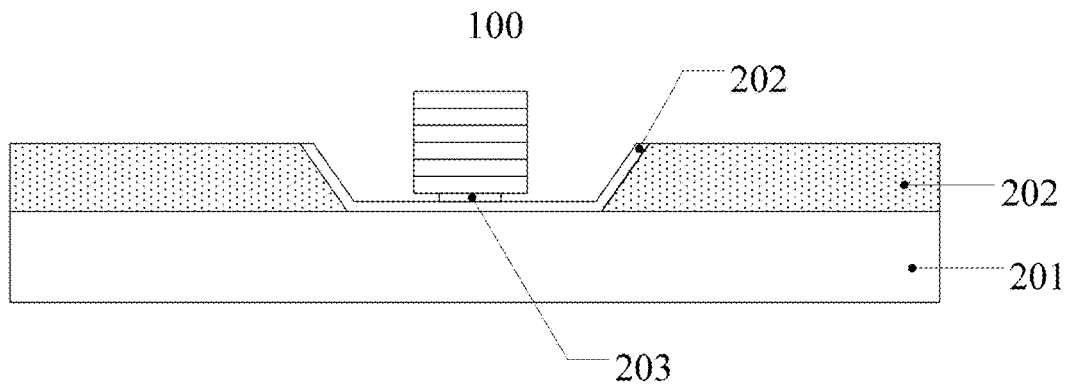
FIG. 8a is a schematic diagram of the LED unit being transferred onto the receiving substrate in a manufacturing method of a light-emitting diode substrate provided by an embodiment of the present disclosure.

It can be as illustrated in FIG. 8*a* after the LED units 100 are transferred onto the receiving substrate 02. In some examples, the manufacturing method of the LED substrate can further include: performing a heat treatment after the LED units 100 are transferred onto the receiving substrate 02, so that the LED units 100 within each of the sub-pixel regions 200 is electrically connected with the first electrode 216, to be further electrically connected with the drain electrode 215 of the thin film transistor. For example, when the LED units are being transferred, the supporting substrate 01 and the receiving substrate 02 are heated, to melt the solder points 203 so as to fix the LED units transferred.

Figure 8B:
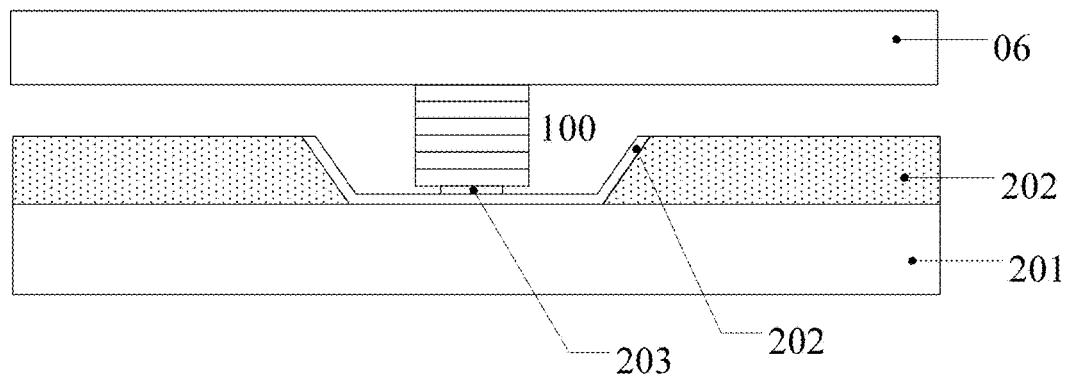
FIG. 8b is a schematic diagram of using a pressurizing substrate for pressurizing after the LED unit is transferred onto the receiving substrate in a manufacturing method of a light-emitting diode substrate provided by an embodiment of the present disclosure.

In some examples, as illustrated in FIG. 8*b*, the manufacturing method of the LED substrate can further include: pressurizing the LED units 100 transferred onto the receiving substrate 02 with a pressurizing substrate 06, after the LED units 100 is transferred onto the receiving substrate 02. For example, after all the LED units 100 have been transferred, if the metal of the solder point is in a molten state, the device cannot be fixed firmly, and the pressurizing substrate 06 is used for applying a certain pressure to the LED units, to help them be better welded within the sub-pixel region. A certain degree of elasticity is needed on a surface where the pressurizing substrate 06 is in contact with the LED units, it can be a polymer elastomer, which will not adsorb the LED units. It should be noted that, this step can be omitted.

Figure 8C:
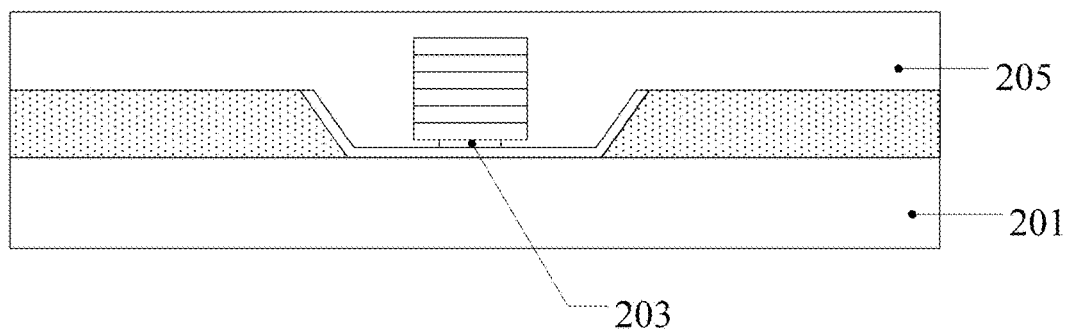
FIG. 8c is a schematic diagram of forming a planarization layer on the LED unit in a manufacturing method of a light-emitting diode substrate provided by an embodiment of the present disclosure.
Figure 8D:
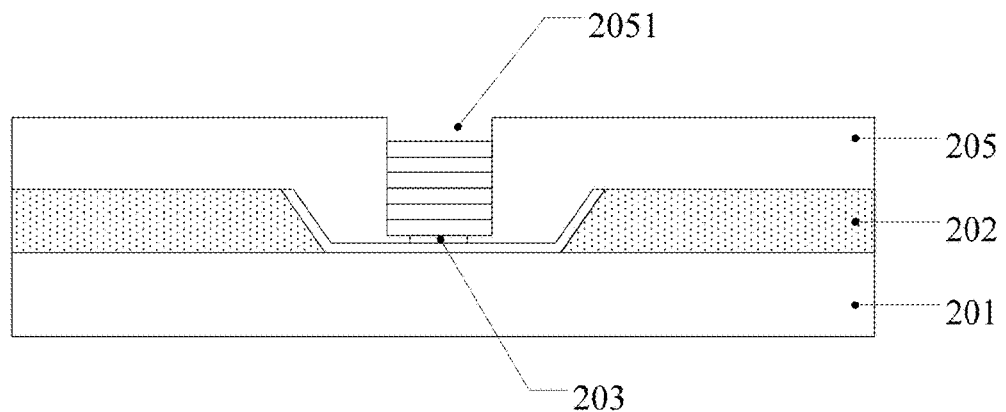
FIG. 8d is a schematic diagram of patterning a planarization layer and exposing the LED unit in a manufacturing method of a light-emitting diode substrate provided by an embodiment of the present disclosure.

In some examples, as illustrated in FIG. 8*c* and FIG. 8*d*, the manufacturing method of the LED substrate can further include: forming a planarization layer 205 on the receiving substrate 02, after the LED units 100 are transferred onto the receiving substrate 02, and patterning the planarization layer 205 to expose each of the LED units 100, so as to form a patterned planarization layer. For example, a via hole 2051 is formed in the planarization layer above each of the LED units.

For example, after the LED units 100 are transferred onto the receiving substrate 02, a planarization layer is coated on an entire surface to play a role of protection. For example, for the planarization layer, a material with better transparency can be selected to ensure light emission efficiency of the LED device, which can be an epoxy group or an acrylic-based resin, for example, it can includes polymethylmethacrylate, polyimide, polyester, and the like. Then a protective layer on top of each of the LED units is removed by using ion beam etching, to form the via hole 2051.

Figure 8E:
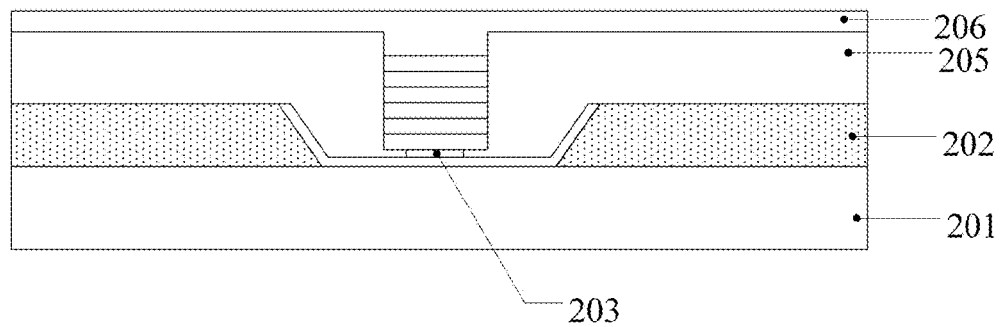
FIG. 8e is a schematic diagram of forming a second electrode of an LED unit in a manufacturing method of a light-emitting diode substrate provided by an embodiment of the present disclosure.

In some examples, as illustrated in FIG. 8*e*, the manufacturing method of the LED substrate can further include: forming a second electrode 206 for each of the LED units 100, after the patterned planarization layer is formed. For example, the second electrode 206 can be a cathode. For example, a layer of metal can be used as the second electrode 206 by using a sputtering method. The formed metal layer does not need to be too thick, it can have good light transmittance, and the selected metal can be magnesium, silver, or a magnesium and silver alloy, and its thickness can be, for example, 5 nm to 50 nm.

Figure 8F:
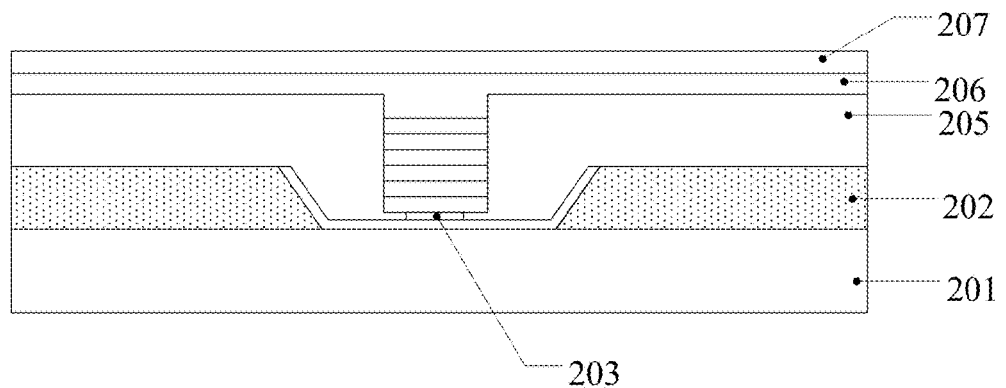
FIG. 8f is a schematic diagram of forming an insulating protective layer on the second electrode in a manufacturing method of a light-emitting diode substrate provided by an embodiment of the present disclosure.

In some examples, as illustrated in FIG. 8*f*, the manufacturing method of the LED substrate can further include: forming an insulating protective layer 207 on the second electrode 206. For example, an insulating protective layer 207 can be formed by vapor deposition or coating.

Figure 8G:
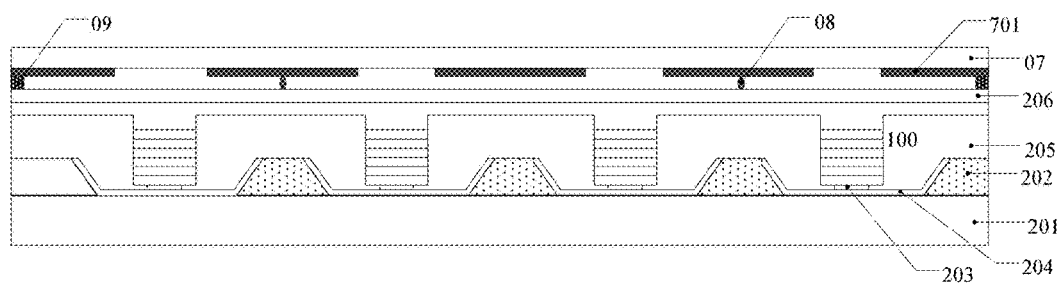
FIG. 8g is a schematic diagram of a display device of a light-emitting diode substrate provided by an embodiment of the present disclosure.

Finally, the encapsulation substrate 07 on which a black matrix 701 shielding layer has been manufactured can be bonded to the LED substrate (a display substrate) by using an encapsulation technology to form a display device, and the display device can be as illustrated in FIG. 8*g*. For example, an RGB full-color display device can be formed. The encapsulation substrate 07 can be, for example, a glass substrate, but is not limited hereto. The encapsulation technology includes, for example, frit encapsulation or photosensitive adhesive encapsulation. FIG. 8*g* also illustrates a photo spacer (PS) 08 and an encapsulation material 09 for encapsulating the display device. The photo spacer 08 can play a role in supporting the encapsulation substrate 07, keep a certain distance between the encapsulation substrate 07 and the receiving substrate, which can prevent damage to the sub-pixels during a touching or pressing operation. The photo spacer 08 can be formed on the encapsulation substrate 07, and can also be formed on the receiving substrate 02, which is not limited by the embodiment of the present disclosure.

Another embodiment of the present disclosure further provides an LED substrate, formed by the manufacturing method of any one of the above-described LED substrates.

Another embodiment of the present disclosure further provides a display device, including any one of the above-described LED substrates.

In the manufacturing method of the LED substrate provided by the embodiment of the present disclosure, the micro-scale LED display can be manufactured by using the semiconductor display technology, which is conducive to reduction of production costs and improvement of the yield. It is particularly suitable for manufacturing of the small-sized display product used in the mobile terminal product, particularly, a smart wearable product, for example, a smart watch, a smart bracelet, and so on.

The following is to be noted.

(1) The same reference numerals denote the same elements/components unless otherwise defined.

(2) In the drawings of the present disclosure, only the structures related to the embodiments of the present disclosure are involved, other structures can refer to usual designs.

(3) In order to clearly illustrate, a layer or an area may be amplified in the drawings of the embodiments of the present disclosure. It is to be understood that, when a member such as a layer, a film, an area or a substrate is located or disposed on or below another member, the member can be located or disposed on or below the another member directly, or an intermediate member or intermediate member(s) can be disposed.

(4) The features in different embodiments or different features in the same embodiments can be combined without conflict.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

This application claims the benefit of priority from Chinese patent application No. 201610245083.X, filed on Apr. 19, 2016, the disclosure of which is incorporated herein in its entirety by reference as a part of the present application.

What is claimed is:

1. A manufacturing method of a light-emitting diode (LED) substrate, comprising:
    disposing a supporting substrate supporting a plurality of LED units to be opposed to a receiving substrate so that a side of the supporting substrate facing the receiving substrate supports the plurality of LED units, wherein the receiving substrate is provided thereon with a pixel definition layer, the pixel definition layer defines a plurality of sub-pixel regions, each of the sub-pixel regions is configured to receive at least one of the LED units, a solder point and an auxiliary metal member are both provided in the sub-pixel region, the auxiliary metal member is provided at a periphery of the solder point, an interval is provided between the solder point and the auxiliary metal member in a plan view of the receiving substrate, and a melting point of the auxiliary metal member is higher than a melting point of the solder point; and
    irradiating a side of the supporting substrate away from the receiving substrate with laser, stripping the LED units from the supporting substrate, and transferring the LED units onto the receiving substrate so that the at least one of the LED units in the sub-pixel region is in contact with both the solder point and the auxiliary metal member.

2. The manufacturing method of the LED substrate according to claim 1, wherein, a mask is further provided on the side of the supporting substrate away from the receiving substrate, and the mask is provided with a plurality of openings therein;
    the laser irradiates a side of the mask away from the supporting substrate, to strip the LED units corresponding to positions of the plurality of openings of the mask from the supporting substrate, and transfer the LED units stripped away onto the receiving substrate.

3. The manufacturing method of the LED substrate according to claim 2, wherein, the plurality of openings of the mask are arranged in an array or arranged in parallel.

4. The manufacturing method of the LED substrate according to claim 2, wherein, each of the openings in the mask corresponds to at least one of the LED units.

5. The manufacturing method of the LED substrate according to claim 1, wherein, a thickness of the pixel definition layer is smaller than a thickness of each of the LED units.

6. The manufacturing method of the LED substrate according to claim 1, wherein, a projection of each of the LED units on the receiving substrate covers a projection of the solder point corresponding thereto on the receiving substrate.

7. The manufacturing method of the LED substrate according to claim 1, wherein the auxiliary metal member is provided around the solder point.

8. The manufacturing method of the LED substrate according to claim 7, wherein, the auxiliary metal member is in a shape of a rectangle, a circle, or multiple dispersed points.

9. The manufacturing method of the LED substrate according to claim 1, wherein, on the receiving substrate, each of the sub-pixel regions comprises a first electrode, and the first electrode is electrically connected with a drain electrode of a thin film transistor on the receiving substrate.

10. The manufacturing method of the LED substrate according to claim 9, further comprising: performing a heat treatment after the LED units are transferred onto the receiving substrate, so that the at least one of the LED units within each of the sub-pixel regions is electrically connected with the first electrode, to be further electrically connected with the drain electrode of the thin film transistor.

11. The manufacturing method of the LED substrate according to claim 4, wherein, each of the sub-pixel regions of the receiving substrate is provided with a reflective layer.

12. The manufacturing method of the LED substrate according to claim 1, further comprising: pressurizing the LED units transferred onto the receiving substrate with a pressurizing substrate, after the LED units are transferred onto the receiving substrate.

13. The manufacturing method of the LED substrate according to claim 1, further comprising: forming a planarization layer on the receiving substrate, after the LED units are transferred onto the receiving substrate, and patterning the planarization layer to expose each of the LED units, so as to form a patterned planarization layer.

14. The manufacturing method of the LED substrate according to claim 1, wherein, each of the LED units comprises a light-emitting stacked layer, a current dispersion layer and a bonding layer; the current dispersion layer is configured to disperse current, and the bonding layer is configured to be in contact with the receiving substrate.

15. The manufacturing method of the LED substrate according to claim 13, further comprising: after forming the patterned planarization layer, forming a second electrode for each of the LED units.

16. The manufacturing method of the LED substrate according to claim 15, further comprising: forming an insulating protective layer located on the second electrode.

17. An LED substrate, formed by using the method according to claim 1.

18. A display device, comprising the LED substrate according to claim 17.

* * * * *